(12) United States Patent
Liu

(10) Patent No.: US 6,880,724 B1
(45) Date of Patent: Apr. 19, 2005

(54) SYSTEM AND METHOD FOR SUPPLYING PHOTORESIST

(75) Inventor: Shun-Tsai Liu, Hsinchu (TW)

(73) Assignee: Macronix International Co., Ltd., (TW)

( * ) Notice: Subject to any disclaimer, the term of this patent is extended or adjusted under 35 U.S.C. 154(b) by 0 days.

(21) Appl. No.: 10/205,573

(22) Filed: Jul. 24, 2002

(51) Int. Cl.⁷ ............................................. G01F 11/00
(52) U.S. Cl. .......................... 222/1; 222/61; 222/66; 222/135; 222/152
(58) Field of Search ............................. 222/61, 64, 65, 222/66, 135, 144.5, 152, 1

(56) References Cited

U.S. PATENT DOCUMENTS

| | | | | |
|---|---|---|---|---|
| 5,156,298 A | * | 10/1992 | LaRue | .......................... 222/66 |
| 5,405,443 A | * | 4/1995 | Akimoto et al. | ............ 118/668 |
| 6,021,921 A | * | 2/2000 | Lan et al. | ...................... 222/61 |
| 6,640,996 B1 | * | 11/2003 | Jones et al. | ..................... 222/1 |

* cited by examiner

Primary Examiner—Joseph A. Kaufman
(74) Attorney, Agent, or Firm—Martine & Penilla, LLP

(57) ABSTRACT

A photoresist supply system includes a storage bottle and a reservoir coupled in flow communication therewith. A vacuum pump is coupled in flow communication with the reservoir and creates a vacuum within the reservoir that draws photoresist out of the storage bottle and into the reservoir. An inlet into the reservoir is configured to flow photoresist down an inner wall of the reservoir. The photoresist flows out of the reservoir into a dispense reservoir from which the photoresist is pumped to a dispense nozzle for application to a wafer or substrate.

13 Claims, 2 Drawing Sheets

SYSTEM AND METHOD FOR SUPPLYING PHOTORESIST

BACKGROUND OF THE INVENTION

1. Field of the Invention

The present invention relates generally to semiconductor wafer and compact disc manufacturing, and more particularly to a system and method for supplying photoresist or other similar processing fluid.

2. Description of the Related Art

In the fabrication of semiconductor wafers, photolithography processes are used to create patterns on a wafer surface. A critical process in wafer fabrication, photolithography generally determines the surface dimensions of the fabricated circuits and circuit structures. As integrated circuits become smaller and the density of transistors on integrated circuit chips increases, the precision of photolithography, and the ability to pattern smaller and smaller features, gains increasing importance in the evolution of semiconductor manufacturing.

Generally speaking, the photolithography process includes applying a photoresist to a surface layer of a semiconductor wafer, and then exposing the photoresist to light through a pattern to transfer the pattern to the photoresist and change the structure and properties in the photoresist in regions corresponding to the pattern. The photoresist is then developed to remove either the photoresist of the pattern or the photoresist around the pattern, according to the type of photoresist used, to define the pattern in photoresist on the surface layer of the wafer. Once the desired photoresist has been developed, features are defined in the surface layer of the semiconductor wafer in accordance with the pattern by such processes as etching. Typically, photoresist is resistant to chemical etching solutions so that only those areas defined in the surface layer of the semiconductor wafer where the developing of the photoresist has removed the photoresist from the surface layer of the wafer will be etched to define the desired features.

In other technologies, photoresist is also used in optical disc mastering processes. In the fabrication of optical disc masters, a glass, polycarbonate, or other suitable material, substrate is coated with a photoresist. The photoresist-covered disc is then selectively exposed by a mastering laser. After exposure, the disc is treated with a developing solution to remove either the exposed or the non-exposed regions of the photoresist, depending on the type of photoresist used. The developed disc with the remaining photoresist forms a physical template of a structure of the disc.

As is known, photoresist is generally a light-sensitive chemical, and the sensitivity is typically to a specific range of light wavelengths. Exposure to light within the range of wavelengths to which the photoresist is sensitive changes the structure and properties of the photoresist. Depending on the type of photoresist used, the change in structure and properties is usually from a soluble condition to an insoluble condition, or from a generally non-soluble structure to a more soluble structure. In either case, the exposed photoresist is developed after exposure, and the developing of the photoresist typically results in the removal of the soluble portion of the photoresist to define the pattern with the remaining, generally insoluble, photoresist.

To define ever smaller, and ever more complex, features in photoresist, the photoresist must be free of contaminates, of a desired viscosity, and of uniform consistency. The size of the wafer or disc to which the photoresist is to be applied is considered for the desired viscosity of photoresist and for the desired thickness to which the photoresist will be applied. The photoresist must adhere uniformly to the surface of the wafer or disc, and must be distributed evenly and of sufficient thickness to serve as an etch barrier in those regions that remain on the surface of the wafer or disc to define the pattern.

Photoresist is typically applied to a wafer or disc using a spin-chuck or other similar type of apparatus in which the photoresist is deposited to a center region of a wafer or disc which is rotated to distribute the photoresist across the surface of the wafer or disc. The photoresist is commonly dispensed from a nozzle positioned over the surface of the wafer or disc. The photoresist is typically maintained in a storage tank or reservoir, and pumped through the nozzle during application. In such a system, the photoresist is first pumped into a supply reservoir, and then is pumped from the supply reservoir to the dispensing nozzle.

In the typical prior art photoresist supply system as described above, microbubbles can be introduced into the photoresist. Such microbubbles constitute unacceptable contaminants in photoresist. The presence of microbubbles can cause defects in fabricated structures in a plurality of ways including, distorting the pattern to be transferred and fabricated on the surface layer of the wafer or disc by preventing sharp definition of pattern boundaries, failing to provide the necessary etch barrier where required, preventing the photoresist from adhering to the surface layer of the wafer or disc resulting in inadvertent photoresist removal during the developing process, and other such fabrication defects.

In view of the foregoing, what is needed is a method and system to supply photoresist or other similar material that substantially prevents the formation of microbubbles.

SUMMARY OF THE INVENTION

Broadly speaking, the present invention fills these needs by providing a vacuum or negative pressure photoresist supply system connecting one or more photoresist storage bottles through a bottle auto-change valve to dispense photoresist or other similar material. The present invention can be implemented in numerous ways, including as a process, an apparatus, a system, a device, and a method. Several embodiments of the present invention are described below.

In accordance with one aspect of the present invention, a photoresist supply system is provided. In one embodiment, the photoresist supply system includes a storage bottle for storing a photoresist material. The storage bottle has an outlet. The photoresist supply system further includes a reservoir, which has a reservoir inlet and is coupled in flow communication with the storage bottle. A vacuum pump is coupled in flow communication with the reservoir.

In another embodiment, the photoresist supply system includes a second storage bottle for storing a photoresist material. The second storage bottle also has an outlet. The photoresist supply system further includes a second reservoir which has a reservoir inlet and is coupled in flow communication with the second storage bottle. A second vacuum pump is coupled in flow communication with the second reservoir.

In yet another embodiment, the photoresist supply system includes a bottle auto-change valve coupled in flow communication with an outlet of the first reservoir and an outlet of the second reservoir. The bottle auto-change valve is configured to selectively couple one of the first reservoir and the second reservoir with a dispense reservoir.

In still a further embodiment, the inlet of the first reservoir of the photoresist supply system is configured to flow the photoresist in contact with an inner sidewall of the first reservoir, and the inlet of the second reservoir is configured to flow the photoresist in contact with an inner sidewall of the second reservoir.

In another embodiment, the photoresist supply system includes a dispense pump coupled in flow communication with the dispense reservoir. A dispense nozzle is coupled in flow communication with the dispense pump and configured to dispense photoresist on to a surface of a substrate.

In accordance with another aspect of the invention, a method for supplying photoresist is provided. In this method, a first reservoir in flow communication with a dispense reservoir in which photoresist is drawn into the first reservoir from a first storage tank with a vacuum is provided. A second reservoir in flow communication with the dispense reservoir in which photoresist is drawn into the second reservoir from a second storage tank with a vacuum also is provided. The photoresist is selectively flowed from one of the first reservoir and the second reservoir into the dispense reservoir.

In one embodiment, the photoresist is drawn into the first and second reservoirs by contacting respective inner walls of these reservoirs with the photoresist.

The advantages of the present invention are numerous. One notable benefit and advantage is that the vacuum or negative pressure photoresist supply system of the invention provides photoresist to a tool or system by using vacuum or negative pressure to flow the photoresist through the system thereby substantially eliminating the formation of microbubbles caused by pressurized nitrogen or other gas or medium typically used in conventional supply systems. Microbubbles essentially contaminate photoresist resulting in unacceptable and expensive defects and scrap in manufacturing. By substantially eliminating a source of microbubble formation, the present invention increases production yields and thereby lowers the costs associated with manufacturing.

Another benefit is the further elimination of microbubble formation by providing an inlet that flows the photoresist down an inner sidewall of a photoresist reservoir in the negative pressure photoresist supply system. The flowing of the photoresist down the inner sidewall essentially prevents the formation of microbubbles caused by photoresist flowing into a reservoir or storage tank through an inlet pipe and falling into a storage reservoir of photoresist. The photoresist supply system of the present invention incorporates an inlet configured to flow down an inner wall of a storage tank or reservoir for photoresist. When photoresist flows into the storage tank or reservoir through the inlet, the photoresist flows to and then smoothly down the inner wall of the storage tank or reservoir and prevents microbubble formation while avoiding excessive mixing and churning of photoresist.

An additional benefit is a bottle auto-change valve used in embodiments of the present invention. The bottle auto-change valve provides for the connecting of two or more photoresist supply systems so that as a supply source is exhausted, another source is automatically connected and thereby constant supply is maintained without interruption in system operation. By assuring constant supply, possible system purge requirements if air, nitrogen, or other gas or medium enters the system during change over are prevented.

Other advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF EXEMPLARY EMBODIMENTS

Several exemplary embodiments for a photoresist supply system will now be described. In the exemplary embodiments, a supply system includes a negative pressure supply system, and a photoresist reservoir with an inlet design feature so that the formation of microbubbles within the photoresist supply system is substantially prevented. In the following description, numerous specific details are set forth in order to provide a thorough understanding of the present invention. It will be understood, however, to one skilled in the art, that the present invention may be practiced without some or all of these specific details. In other instances, well known process operations have not been described in detail to avoid obscuring the present invention unnecessarily.

Figure 1:
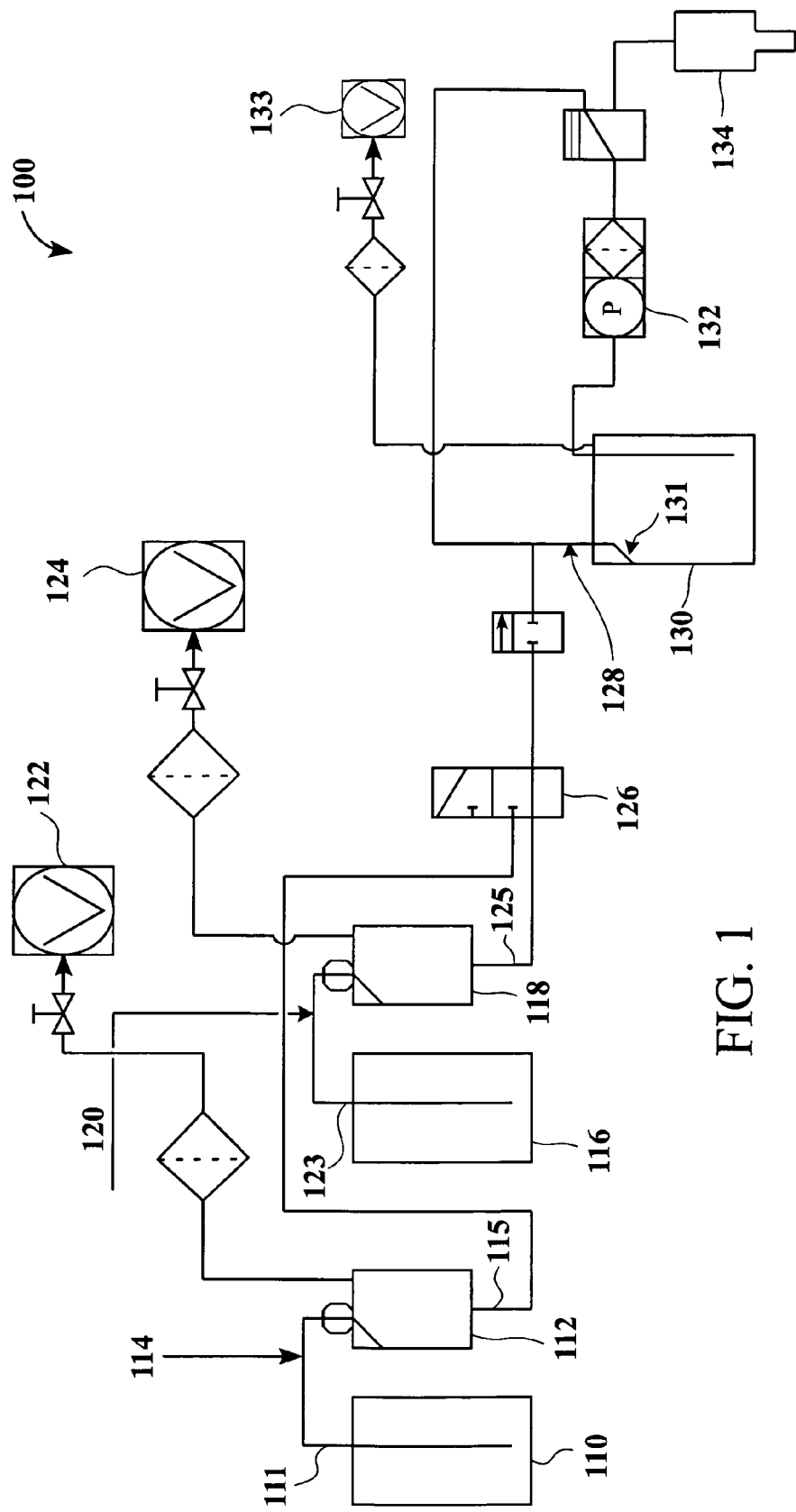
FIG. 1 is a schematic diagram of a photoresist supply system in accordance with one embodiment of the present invention.

FIG. 1 is a schematic diagram of a photoresist supply system 100 in accordance with one embodiment of the present invention. As shown in FIG. 1, a first storage bottle 110 supplies a first reservoir 112 through first inlet pipe 114. A second storage bottle 116 is shown supplying a second reservoir 118 through second inlet pipe 120. First vacuum pump 122 is attached to first reservoir 112, and second vacuum pump 124 is attached to second reservoir 118. In the illustrated embodiment, the photoresist supply system includes two vacuum systems with two vacuum pumps 122, 124, one attached to each of the two separate reservoirs 112, 118 to maintain a constant supply of photoresist. In other embodiments, photoresist supply systems include a single vacuum system with one vacuum pump attached to one or more reservoirs, a plurality of vacuum systems with more than one vacuum pump attached to a plurality of reservoirs, or any combination of vacuum pumps and reservoirs to supply photoresist according to desires or system requirements.

The photoresist supply system 100 shown in FIG. 1 includes a bottle auto-change valve 126, which manages a selection of photoresist to be from one of the first reservoir 112 and the second reservoir 118 to maintain the constant supply of photoresist. In other embodiments, the bottle auto-change valve 126 is configured to accommodate as many reservoirs as incorporated into the photoresist supply system. In still other embodiments, a plurality of auto-change valves are included to manage the selection of photoresist from as many reservoirs as may be incorporated into the photoresist supply system.

Dispense inlet pipe 128 supplies photoresist from the selected reservoir 112, 118 to the dispense reservoir 130. Dispense reservoir vacuum pump 133 creates a negative pressure in dispense reservoir 130 to flow the photoresist from the selected reservoir 112, 118 into the dispense reservoir 130.

In one embodiment, a system controller (not shown) manages the supply of photoresist and automatically directs the selection and switching from one reservoir 112, 118 to the other reservoir 112, 118, when a pre-determined level of photoresist is reached in the selected reservoir 112, 118. In one embodiment, an alert is presented to a system operator when the pre-determined level of photoresist is reached in the selected reservoir 112, 118, prompting manual activation of the bottle auto-change valve 126, or advising of impending system activation of the bottle auto-change valve 126.

In the illustrated embodiment, photoresist in dispense reservoir 130 is pumped with dispense pump 132 through dispense nozzle 134 to the surface of a wafer or disc (not shown). As shown in FIG. 1, one embodiment of the photoresist supply system of the present invention includes a photoresist supply system having two storage bottles 110, 116, and two reservoirs 112, 118, and at least two vacuum systems corresponding to the two reservoirs 112, 118, with a first vacuum pump 122 attached to a first reservoir 112, and a second vacuum pump 124 attached to a second reservoir 118. A bottle auto-change valve 126 is included to maintain a constant supply of photoresist, and the photoresist flows through the supply system to a dispense reservoir 130.

A third vacuum pump 133 is incorporated into the photoresist supply system to create and maintain a negative pressure in the dispense reservoir 130 to flow photoresist from a selected reservoir 112, 118 into the dispense reservoir 130. The photoresist is dispensed onto a surface of a wafer or disc by pumping the photoresist from the dispense reservoir 130 and through dispense nozzle 134.

One embodiment of the present invention operates to provide a negative pressure supply system for supply and dispensing of photoresist or other similar material. As described above, photoresist must be maintained and dispensed free of contaminates. For purposes of the description of the invention, microbubbles in the photoresist material are contaminates. In embodiments of the present invention, the formation of microbubbles in the photoresist supply system is substantially eliminated. Unlike prior art photoresist supply systems, which typically pressurize the photoresist supply system with nitrogen gas under positive pressure that can introduce microbubbles into the photoresist, in embodiments of the present invention negative pressure is used to draw and flow the photoresist through the photoresist supply system, and thereby substantially eliminate the formation of microbubbles.

In one embodiment of the invention, a source of contamination is essentially eliminated by the use of vacuum pumps 122, 124, 133 in the photoresist supply system. First vacuum pump 122 is attached to first reservoir 112 and creates a negative pressure in first reservoir 112. First vacuum pump 122 is configured to create sufficient negative pressure in first reservoir 112 to draw photoresist out of first storage bottle 110 through a first storage outlet 111 and into first reservoir 112 through first inlet pipe 114. In one embodiment, the negative pressure generated is sufficient to draw the photoresist out of first storage bottle 110 into first reservoir 112, but not so great as to prevent the flow of photoresist out of first reservoir 112 through first reservoir outlet 115. Photoresist is therefore allowed to flow out of first reservoir 112 through first reservoir outlet 115, through bottle auto-change valve 126 and into dispense reservoir 130 through dispense inlet pipe 128.

Similarly, second vacuum pump 124 is attached to second reservoir 118 and creates a negative pressure in second reservoir 118. The negative pressure in second reservoir 118 draws photoresist out of second storage bottle 116 through second storage outlet 117 and into second reservoir 118 through second inlet pipe 120. Second vacuum pump 124 is configured to create sufficient negative pressure in second reservoir 118 to draw photoresist out of second storage bottle 116 through a second storage outlet 117 and into second reservoir 118 through second inlet pipe 120. In one embodiment, the negative pressure generated is sufficient to draw the photoresist out of second storage bottle 116 into second reservoir 118, but not so great as to prevent the flow of photoresist out of second reservoir 118 through second reservoir outlet 125. Photoresist is therefore allowed to flow out of second reservoir 118 through second reservoir outlet 125, through bottle auto-change valve 126 and into dispense reservoir 130 through dispense inlet pipe 128.

Finally, third vacuum pump 130 is attached to dispense reservoir 130 and creates a negative pressure in dispense reservoir 130. The negative pressure created in dispense reservoir 130 draws photoresist out of the selected reservoir 112, 118, through bottle auto-change valve 126, through dispense inlet pipe 128, and into dispense reservoir 130.

In other embodiments, a single vacuum pump is used for one or more reservoirs. A plurality of vacuum pumps may be incorporated for embodiments in which a plurality of reservoirs are incorporated into large photoresist supply systems according to system demands.

The vacuum, or negative pressure, system provides for the flow of photoresist from storage to dispense without the introduction of nitrogen or other gas that can generate microbubbles in the photoresist. The bottle auto-change valve 126 provides for a constant supply of photoresist to be maintained as storage containers are depleted. Additionally, the bottle auto-change valve 126 maintains system up time by essentially eliminating interruption in system operation to replenish photoresist supply bottles, and by substantially eliminating system purge operations that can be associated with photoresist supply change-over, providing increased through-put, and more economical and efficient system utilization. The bottle auto-change valve 126 may include connections for receiving from one up to a plurality of source inlets flowing from photoresist reservoirs, and providing one or more valve outlets flowing to one or more dispense inlet pipes 128 into one or more dispense reservoirs 130. The bottle auto-change valve 126 is configured to select between the one up to the plurality of source inlets to flow through the valve outlet.

In addition to the propensity of pressurized nitrogen gas to form microbubbles in the photoresist, prior art photoresist supply systems also can form microbubbles in photoresist at the entry of photoresist into any of the reservoirs 112, 118, 130 within the photoresist supply system. In one embodiment of the present invention, each inlet pipe 114, 120, 128 through which photoresist flows into an associated reservoir 112, 118, 130, is configured to flow the photoresist through the inlet pipe 114, 120, 128, and down an inner sidewall of the associated reservoir 112, 118, 130. In one embodiment, inlet pipes 114, 120, 128 are arranged such that the photoresist flowing away from an inlet pipe 114, 120, 128, will flow down along an inner sidewall of the reservoir 112, 118, 130.

Figure 2B:
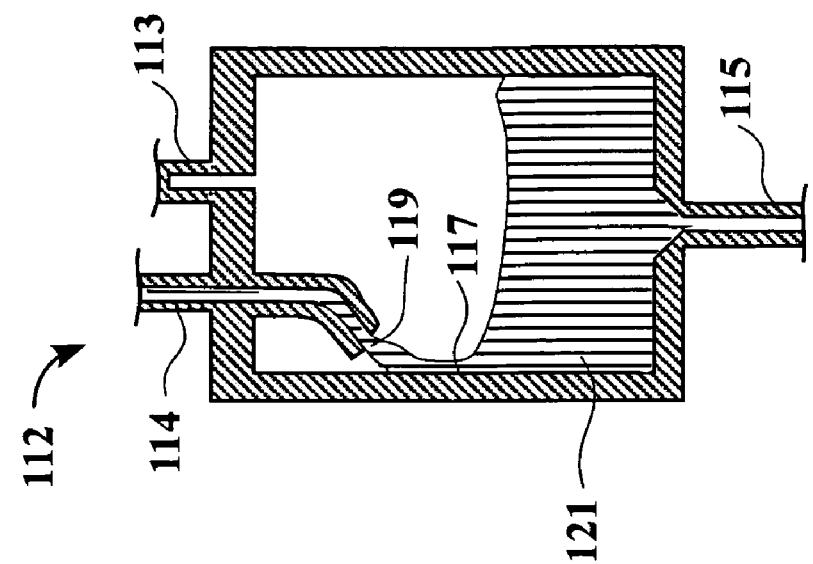
FIG. 2B shows the reservoir of FIG. 2A, with photoresist collecting in the reservoir in accordance with one embodiment of the invention.
Figure 2A:
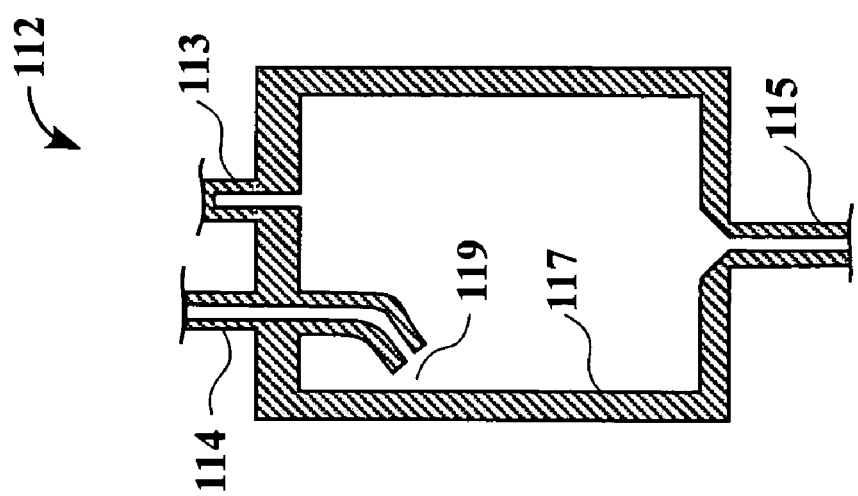
FIG. 2A illustrates a detail view of a reservoir in accordance with one embodiment of the present invention.

FIG. 2A illustrates a detail view of first reservoir 112 in accordance with one embodiment of the present invention. It should be understood that first reservoir 112 is essentially identical to second reservoir 118 (see FIG. 1), and is used here to illustrate features of the present invention. Unless otherwise noted, each of the features described in reference to first reservoir 112 is likewise applicable to second reservoir 118, as well as to any number of additional reservoirs incorporated in other embodiments of the present invention.

First reservoir 112 shown in FIG. 2A includes inlet pipe 114, vacuum inlet pipe 113, an outlet pipe 115, and an inner sidewall 117. Vacuum inlet pipe 113 is connected to first vacuum pump 122 (see FIG. 1), which creates a vacuum in first reservoir 112. Inlet pipe 114 is configured such that photoresist flowing out of inlet pipe 114 contacts inner sidewall 117 at about 119, and flows down along inner sidewall 117.

In accordance with one embodiment of the invention, vacuum, or negative pressure, is introduced into first reservoir 112 via vacuum inlet pipe 113. With sufficient vacuum in first reservoir 112, photoresist is drawn through inlet pipe 114 from first storage bottle 110 (see FIG. 1) into first reservoir 112. Unlike typical prior art photoresist supply systems which place the system under positive pressure, usually from nitrogen gas, and then allow the photoresist to fall from the inlet into the reservoir by simple gravity, in one embodiment of the invention, inlet pipe 114 is configured such that photoresist flowing away from inlet pipe 114 will flow down an inner sidewall 117 of first reservoir 112. In one embodiment, the photoresist contacts the inner sidewall 117 at about 119.

When the photoresist flows through inlet pipe 114, it arrives in first reservoir 112 and flows down inner sidewall 117 to collect in first reservoir 112. FIG. 2B shows the detail view of first reservoir 112 as in FIG. 2A with photoresist 121 collecting in first reservoir 112 in accordance with one embodiment of the invention. The configuration and placement of inlet pipe 114 provides for the photoresist 121 to flow down inner sidewall 117, substantially eliminating a source of microbubble formation. Since the photoresist flowing through inlet pipe 114 does not simply fall into collecting photoresist 121, excessive churning and mixing of photoresist 121 is avoided, and microbubble formation is prevented. Additionally, in one embodiment, the inlet pipe 114 is higher in the reservoir 112 than a level of the collected photoresist in the reservoir 112.

Returning now to FIG. 1, dispense reservoir 130 also includes the dispense inlet pipe 128 configured such that the photoresist flowing away from the dispense inlet pipe 128 flows contacts an inner sidewall, and flows down the inner sidewall as it enters and collects in the dispense reservoir 130 in one embodiment of the invention. The configuration of the inlet pipes in each of the first reservoir 112, the second reservoir 118, and the dispense reservoir 130 substantially prevents microbubble formation in each of these regions of the photoresist supply system. In one embodiment of the invention, the combination of vacuum, or negative pressure, and reservoir inlet contact points essentially eliminates microbubble formation in the photoresist supply system.

As illustrated in FIGS. 1, 2A, and 2B, one embodiment of the present invention includes a photoresist supply system incorporating two vacuum or negative pressure supply systems, each having a reservoir connected to a storage bottle. A vacuum pump is connected to the reservoir and is used to create a vacuum or negative pressure in the reservoir. The vacuum or negative pressure draws photoresist from the storage bottle into the reservoir without generating microbubbles. Similarly, the vacuum or negative pressure in the dispense reservoir flows the photoresist from the selected reservoir through a bottle auto-change valve into the dispense reservoir. The photoresist is then pumped from the dispense reservoir to a dispense nozzle for used in photoresist and other resist coating operations. The auto-change valve provides for seamless changeover between supply reservoirs without interruption of system operation. In alternative embodiments, one or more vacuum systems are configured to one or more reservoirs, which are in turn connected to one or more storage bottles.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A photoresist supply system, comprising:
   a first storage bottle for storing a photoresist material, the first storage bottle having an outlet;
   a second storage bottle for storing a photoresist material, the second storage bottle having an outlet;
   a first reservoir having a reservoir inlet coupled in flow communication with the first storage bottle;
   a second reservoir having a reservoir inlet coupled in flow communication with the second storage bottle;
   a first vacuum pump coupled in flow communication with the first reservoir;
   a second vacuum pump coupled in flow communication with the second reservoir;
   a bottle auto-change valve coupled in flow communication with an outlet of the first reservoir and with an outlet of the second reservoir; and
   a dispense reservoir coupled in flow communication with the bottle auto-change valve through a dispense inlet pipe,
   wherein the bottle auto-change valve is configured to selectively couple the dispense reservoir in flow communication with one of the first reservoir and the second reservoir.

2. The photoresist supply system of claim 1, wherein the first vacuum pump creates a vacuum in the first reservoir to draw the photoresist out of the first storage bottle through the outlet thereof and into the first reservoir through the reservoir inlet.

3. The photoresist supply system of claim 2, wherein the reservoir inlet of the first reservoir is configured to flow the photoresist down an inner sidewall of the first reservoir.

4. The photoresist supply system of claim 1, wherein the second vacuum pump creates a vacuum in the second reservoir to draw the photoresist out of the second storage bottle through the outlet thereof and into the second reservoir through the reservoir inlet.

5. The photoresist supply system of claim 4, wherein the reservoir inlet of the second reservoir is configured to flow the photoresist down an inner sidewall of the second reservoir.

6. A method for supplying photoresist, comprising:
   providing a first reservoir in flow communication with a dispense reservoir, wherein photoresist is drawn into the first reservoir from a first storage tank with a vacuum;
   providing a second reservoir in flow communication with the dispense reservoir, wherein photoresist is drawn into the second reservoir from a second storage tank with a vacuum; and
   selectively flowing photoresist from one of the first reservoir and the second reservoir into the dispense reservoir.

7. The method of claim 6, wherein the operation of drawing photoresist into the first reservoir from the first storage tank with a vacuum includes contacting an inner wall of the first reservoir with the photoresist.

8. The method of claim 6, wherein the operation of drawing photoresist into the second reservoir from the second storage tank with a vacuum includes contacting an inner wall of the second reservoir with the photoresist.

9. The method of claim 6, wherein the operation of selectively flowing photoresist from one of the first reservoir and the second reservoir into the dispense reservoir includes:
   controlling an auto-change valve to cause photoresist to flow into the dispense reservoir from one of the first reservoir and the second reservoir.

10. A photoresist supply system, comprising:
   a first photoresist storage bottle for storing a photoresist solution, the first photoresist storage bottle having an outlet;
   a first reservoir coupled in flow communication with the first photoresist storage bottle, the first reservoir having an inlet and an outlet;
   a first vacuum pump coupled in flow communication with the first reservoir;
   a second photoresist storage bottle for storing a photoresist solution, the second photoresist storage bottle having an outlet;
   a second reservoir coupled in flow communication with the second photoresist storage bottle, the second reservoir having an inlet and an outlet;
   a second vacuum pump coupled in flow communication with the second reservoir;
   a dispense reservoir for storing the photoresist solution received from the first reservoir and the second reservoir, the dispense reservoir having a dispense inlet;
   a bottle auto-change valve coupled in flow communication with the outlet of the first reservoir and the outlet of the second reservoir and the dispense inlet;
   a dispense pump coupled in flow communication with the dispense reservoir; and
   a dispense nozzle coupled in flow communication with the dispense pump and configured to dispense photoresist on to a surface of a substrate.

11. The photoresist supply system of claim 10, wherein the inlet of the first reservoir is configured to flow photoresist down an inner sidewall of the first reservoir.

12. The photoresist supply system of claim 10, wherein the inlet of the second reservoir is configured to flow photoresist down an inner sidewall of the second reservoir.

13. The photoresist supply system of claim 10, wherein the dispense inlet is configured to flow photoresist down an inner sidewall of the dispense reservoir.

* * * * *